(12) United States Patent
Li

(10) Patent No.: US 6,298,552 B1
(45) Date of Patent: Oct. 9, 2001

(54) METHOD FOR MAKING SOCKET CONNECTOR

(75) Inventor: Yu-Sung Li, Yung-Ho (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/502,559

(22) Filed: Feb. 10, 2000

(51) Int. Cl.[7] ....................................... H01K 3/10
(52) U.S. Cl. ................ 29/853; 29/842; 29/845; 29/846
(58) Field of Search .................. 29/832, 890, 825, 29/843, 827, 833, 845, 894, 842, 896, 853

(56) References Cited

U.S. PATENT DOCUMENTS

| | | |
|---|---|---|
| 4,893,172 * | 1/1990 | Matsumoto et al. . |
| 4,950,173 * | 8/1990 | Minemura et al. . |
| 5,632,631 * | 5/1997 | Fjelstad et al. . |
| 5,802,699 * | 9/1998 | Fjelstad et al. . |
| 5,934,914 * | 8/1999 | Fjelstad et al. . |
| 6,086,386 * | 7/2000 | Fjelstad et al. . |

* cited by examiner

Primary Examiner—Carl J. Arbes
(74) Attorney, Agent, or Firm—Wei Te Chung

(57) ABSTRACT

A method for making a socket connector for connecting a CPU module to a circuit board includes the steps of (1) attaching a conductive film to a first face of an insulative plate to form a laminate, the insulative plate defining at least an array of bores therein; (2) photo-etching or laser-etching the conductive film to remove the conductive film with a portion thereof left in the laminate corresponding to each bore of the insulative plate, the portion of the conductive film having a base section attached to the first face of the insulative plate and a beam section extending from the base section over the corresponding bore; and (3) performing a second forming process to bend each beam section through the corresponding bore and partially extending over a second face of the insulative plate to be opposite the base section, the beam section being spaced from the second face of the insulative plate for resilient deformation in engaging the CPU module. A further step of attaching a solder ball to each base section may be selectively taken for surface mounting the socket connector to the circuit board.

14 Claims, 8 Drawing Sheets

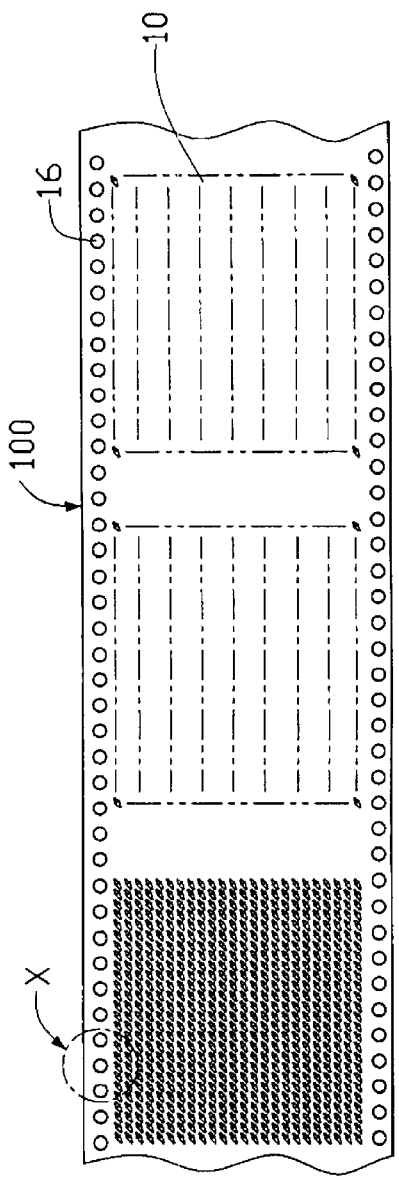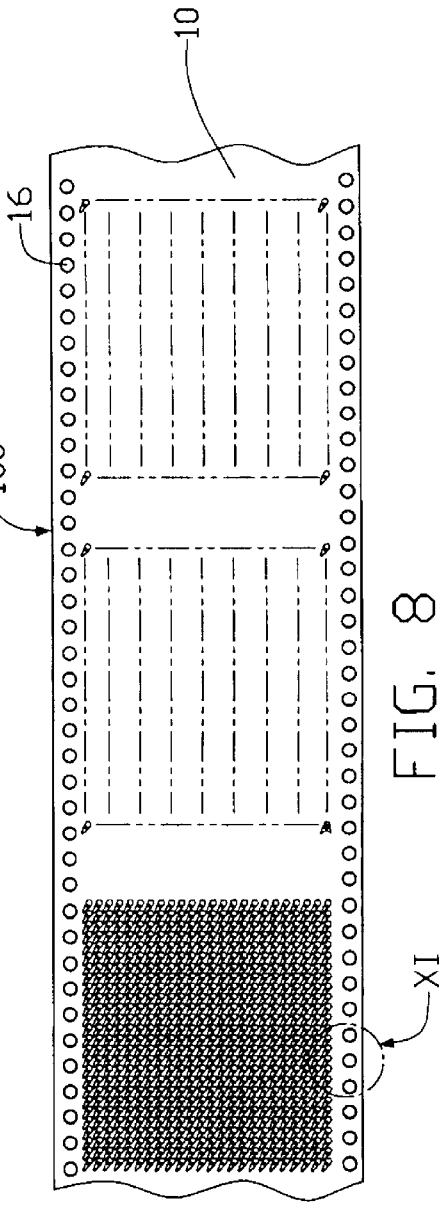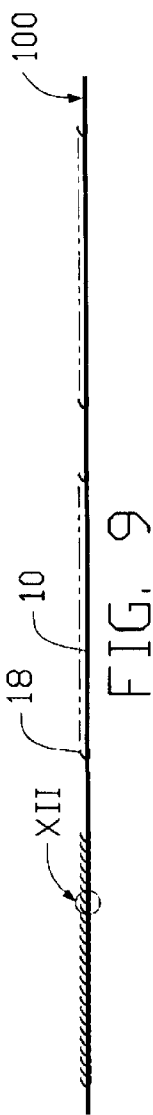

METHOD FOR MAKING SOCKET CONNECTOR

BACKGROUND OF THE INVENTION

1. Field of the Invention

The present invention generally relates to a socket connector for connecting a central processing unit (CPU) module to a circuit board, and in particular to a method for making a low profile socket connector.

2. The Prior Art

Socket connectors for retaining and electrically connecting a CPU module to a circuit board are well known in the art. A socket connector comprises a flat housing defining an array of holes therein for receiving and retaining conductive contacts. The flat housing is positioned on a circuit board and retains a CPU module thereon with the contacts electrically engaging corresponding conductors of the CPU module and the circuit board to establish electrical connection therebetween.

The socket connector requires a predetermined total socket height in order to provide sufficient retention force for the contacts. The contacts so retained undergo elastic deformation when contacted by the corresponding conductors of the CPU module for establish electrical engagement therebetween. As the size of the socket connectors is reduced with the trend of miniaturization, the total socket height is reduced which results in insufficient retention force of the contacts.

Furthermore, the size of the contacts is also reduced leading to a severe problem of yielding when contacted by the corresponding conductor of the CPU module. Yielding of the contacts may cause poor electrical engagement between the contacts of the socket connector and the corresponding conductors of the CPU module.

In addition, the size-reduced contacts represent a problem of poor productability and high flaw rate and thus poor reliability for it is more difficult to make and assemble the contacts to the housing. The poor reliability may also cause problems in mounting the socket to a circuit board by a system integrator or a mother board manufacturer.

It is thus desired to provide a method for efficiently making socket connectors of high reliability and consistent quality for overcoming the problems discussed above.

SUMMARY OF THE INVENTION

Accordingly, an object of the present invention is to provide a method for efficiently making low profile socket connectors.

Another object of the present invention is to provide a method for making socket connectors with low flaw rate.

A further object of the present invention is to provide a method for making socket connector wherein pitch between contacts of the socket connector may be modified easily.

Yet a further object of the present invention is to provide a method for making size-reduced socket connectors wherein yielding of small-sized contacts is prohibited.

A further object of the present invention is to provide a method for making socket connectors having contacts forming the shortest path between a CPU module retained by the socket connector and a circuit board supporting the socket connector.

To achieve the above objects, a method for making socket connectors in accordance with the present invention comprises the steps of (1) attaching a conductive film to a first face of an insulative plate to form a laminate, the insulative plate defining at least an array of bores therein; (2) photo-etching or laser-etching the conductive film to remove the conductive film with a portion thereof left in the laminate corresponding to each bore of the insulative plate, the portion of the conductive film having a base section attached to the first face of the insulative plate and a beam section extending from the base section over the corresponding bore; and (3) performing a second forming process to bend each beam section through the corresponding bore and partially extending over a second face of the insulative plate to be opposite the base section, the beam section being spaced from the second face of the insulative plate for resilient deformation in engaging a CPU module positioned on the second face of the insulative plate. A further step of attaching a solder ball to each base section may be selectively taken for surface mounting the socket connector to a circuit board.

BRIEF DESCRIPTION OF THE DRAWINGS

The present invention will be apparent to those skilled in the art by reading the following description of a preferred embodiment thereof, with reference to the accompanying drawings, in which:

FIG. 7 is similar to FIG. 1 but showing a third step of the method of the present invention in which V-shaped contacts are formed;

FIG. 8 is a bottom view of FIG. 7;

FIG. 9 is a side elevational view of FIG. 7;

DETAILED DESCRIPTION OF THE PREFERRED EMBODIMENT

Figure 1:
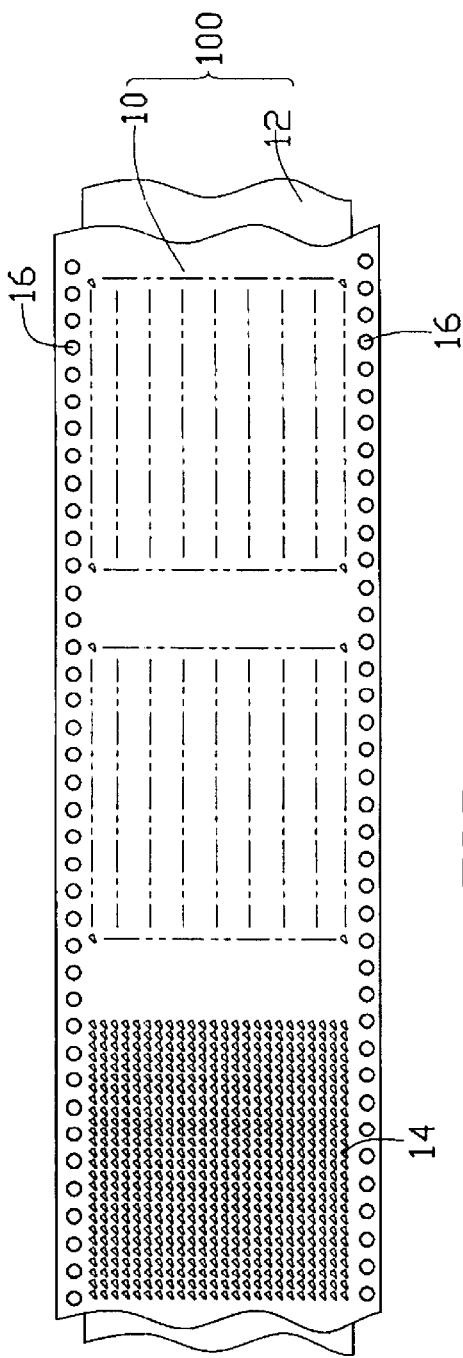
FIG. 1 is a top view of a laminate comprising an insulative plate and a conductive film formed in a first step of a method in accordance with the present invent
Figure 2:
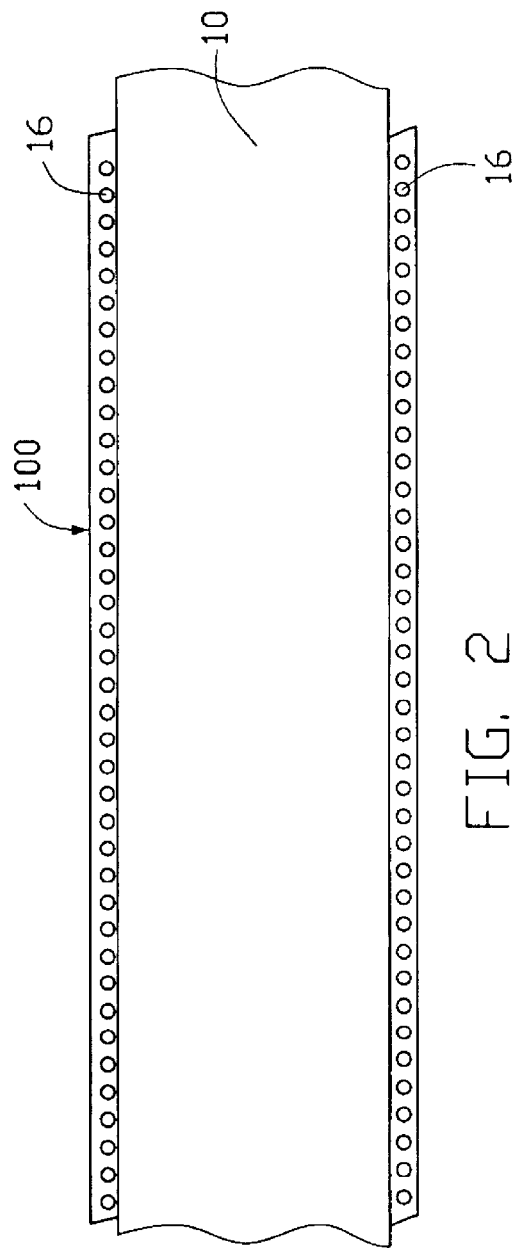
FIG. 2 is a bottom view of the laminate of FIG. 1.
Figure 3:
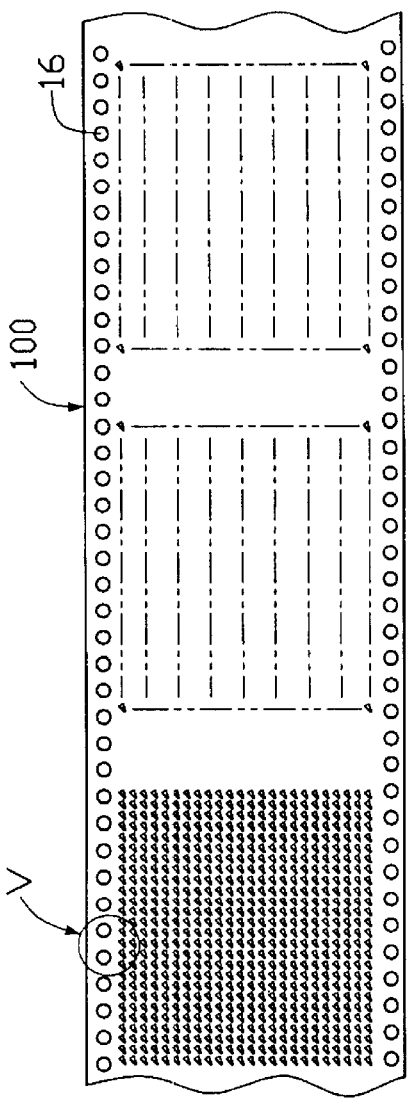
FIG. 3 is similar to FIG. 1 but showing a second step of the method of the present invention in which the conductive film is etched.
Figure 4:
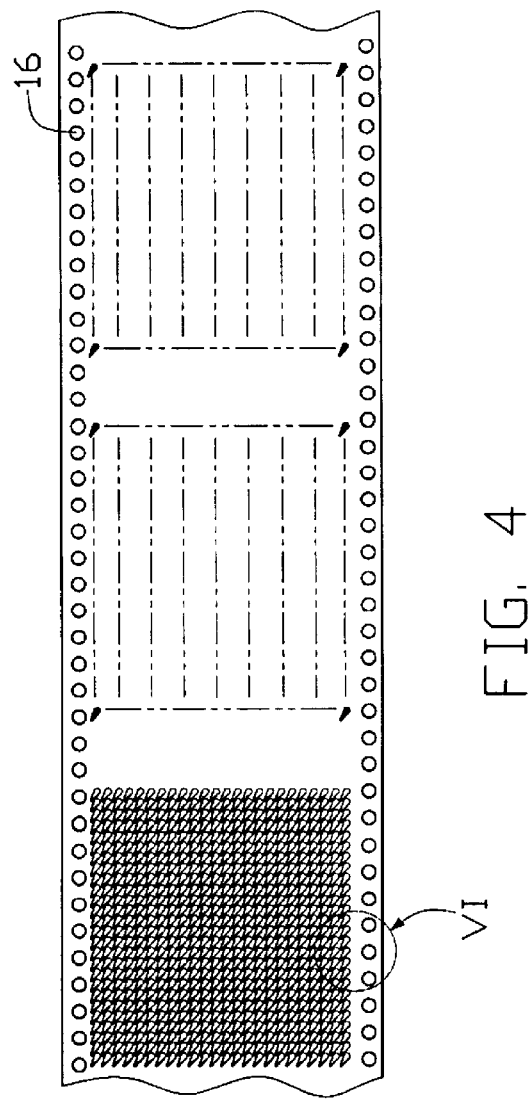
FIG. 4 is a bottom view of FIG. 3.
Figure 6:
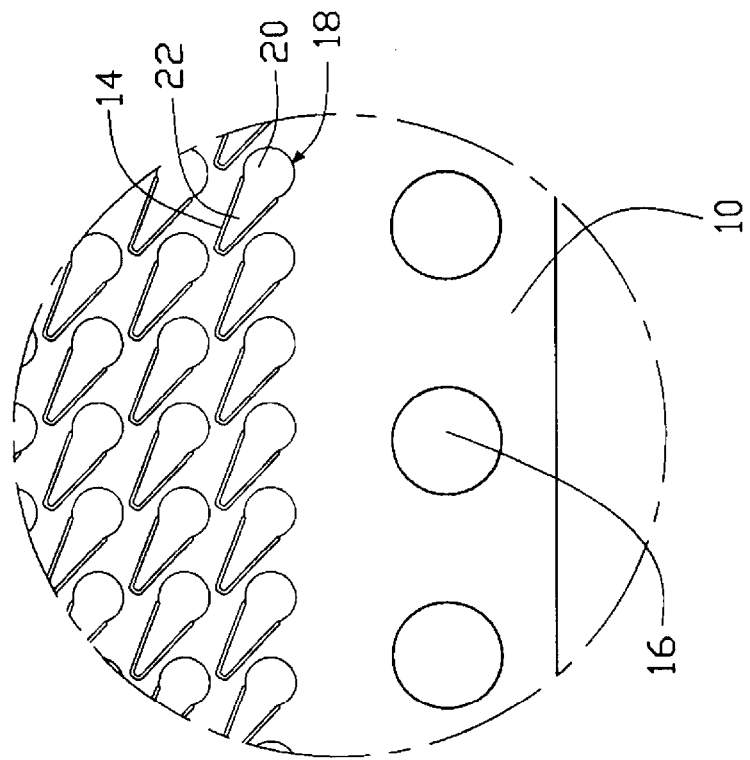
FIG. 6 is an expanded view of encircled portion VI of FIG. 4
Figure 5:
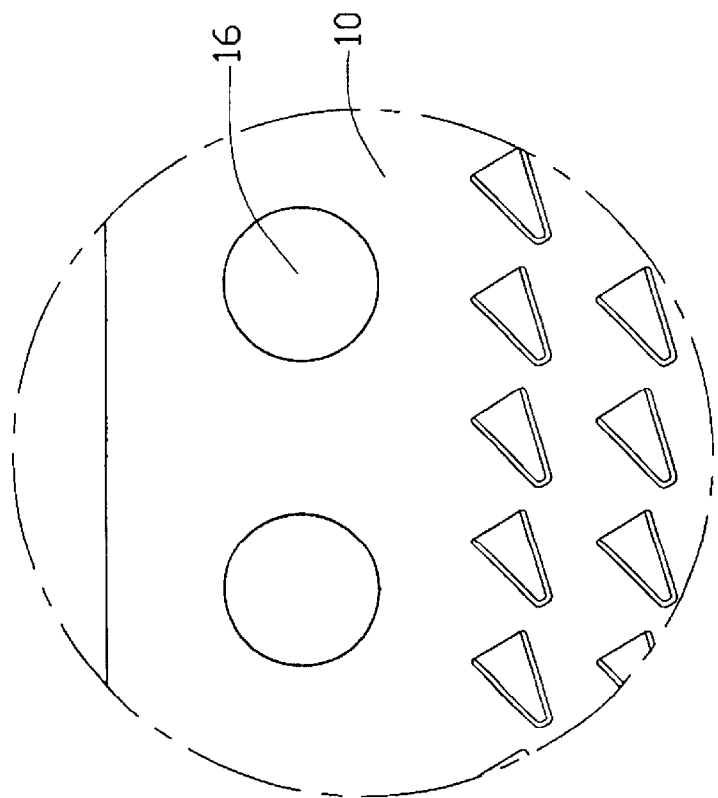
FIG. 5 is an expanded view of encircled portion V of FIG. 3.
Figure 11:
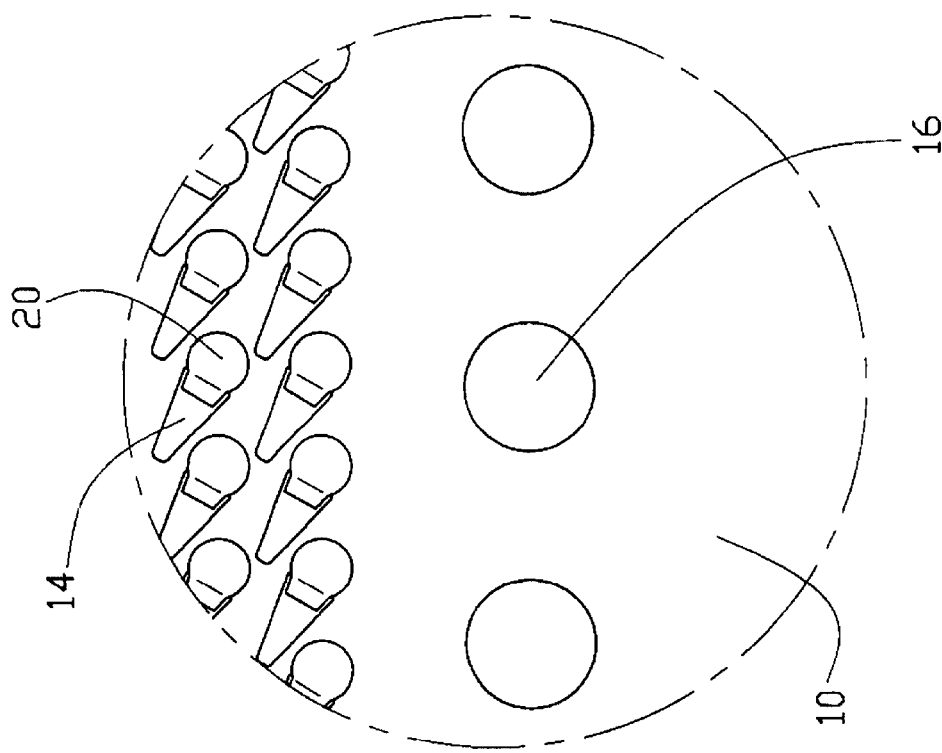
FIG. 11 is an expanded view of encircled portion XI of FIG. 8.
Figure 10:
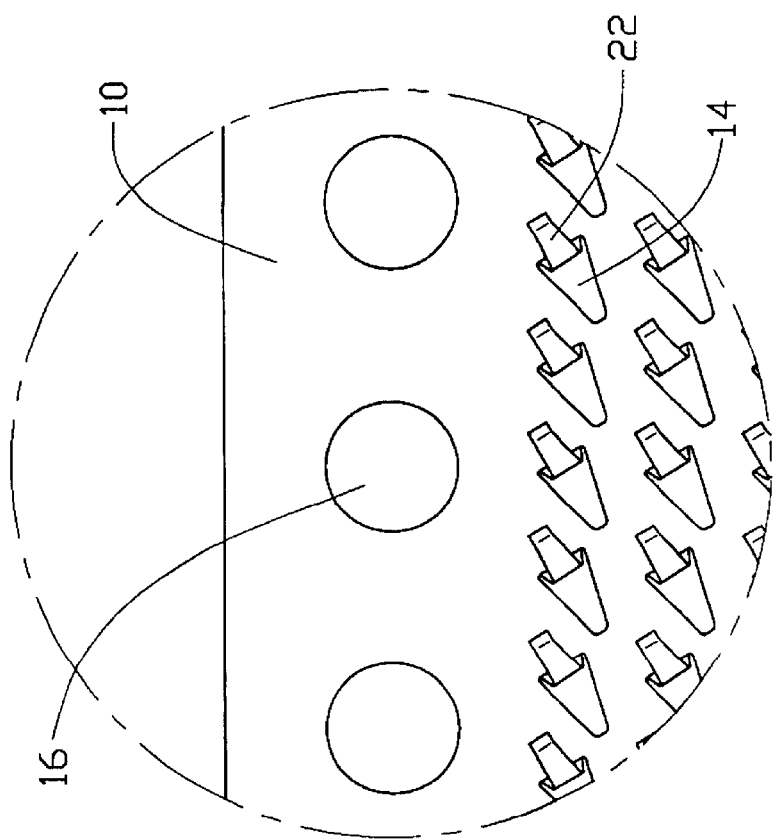
FIG. 10 is an expanded view of encircled portion X of FIG. 7.
Figure 12:
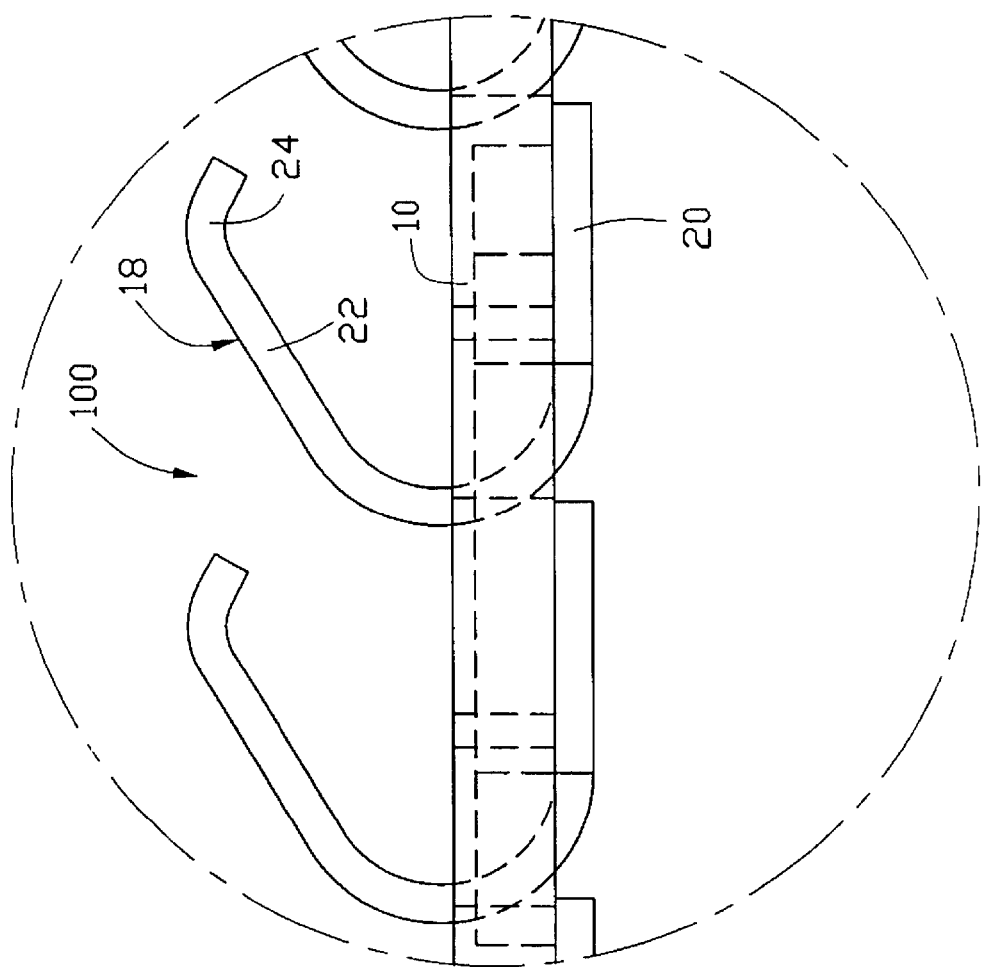
FIG. 12 is an expanded view of encircled portion XII of FIG. 9.

Referring to the drawings, a method for making socket connectors in accordance with the present invention will be described. As shown in FIGS. 1 and 2, an insulative plate 10 is provided having top and bottom faces (not labeled). A conductive film 12 is attached to the bottom face of the insulative plate 10 for forming a thin laminate 100. A plurality of holes 14, forming an array, is defined in the insulative plate 10 for receiving contacts to be formed with the conductive film 12. The holes 14 may be formed before or after the conductive film 12 is attached to the insulative plate 10.

In the embodiment illustrated, the insulative plate 10 and the conductive film 12 are elongate members thereby forming an elongate laminate 100. This allows a number of socket connectors to be formed on a single laminate 100. After the final step is performed, the laminate 100 may then be cut and the individual socket connectors are separated. This enhances manufacturing efficiency. Pilot holes 16 are defined along opposite edges of the plate 10 for guiding the laminate 100 through the manufacturing process.

An example of the insulative material of the plate 10 is Kapton, while that for the conductive film 12 is BeCu. However, other materials may also be employed.

Referring to FIGS. 3–6, cutting means is adapted to cut and remove undesired portions of the conductive film 12 from the laminate 100 with portions 18 for forming contacts left in the laminate 100. Example techniques for removing the conductive film 12 may include photo etching and laser etching. Each portion 18 corresponds to one of the holes 14 of the insulative plate 10. In the embodiment illustrated, each portion 18 comprises a circular base section 20 attached to the bottom face of the insulative plate 10 adjacent the corresponding hole 14 and a beam section 22 extending from the base section 20 over the corresponding hole 14.

If desired, electroplating may be performed on the conductive portions 18.

Figure 13:
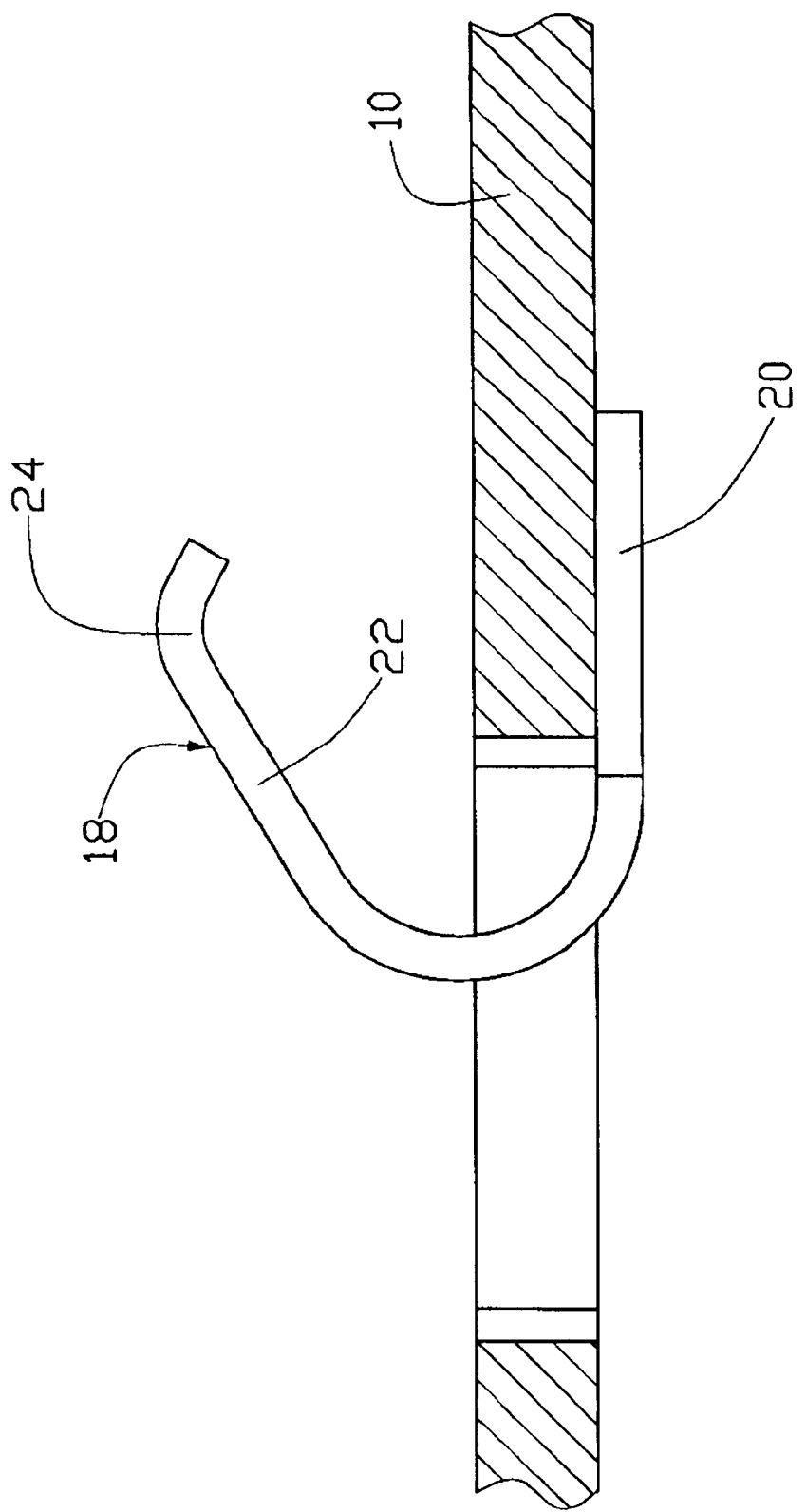
FIG. 13 is a cross-sectional view of the V-shaped contact.
Figure 14:
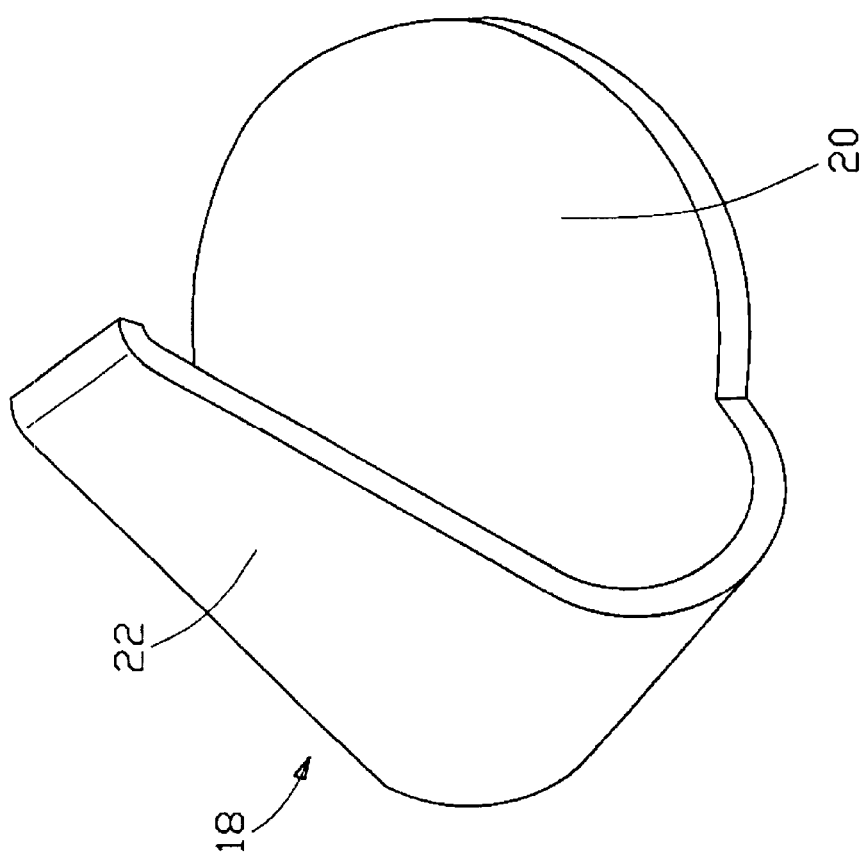
FIG. 14 is a perspective view of the V-shaped contact.

Referring to FIGS. 7–12, a second forming step is performed to bend the beam section 22 of each portion 18 of the conductive film 12 through the corresponding hole 14 whereby the beam section 22 partially extends above the top face of the insulative plate 10 to be opposite the base section 20 forming a substantially V-shaped as shown in FIGS. 13 and 14 with the beam section 22 and the base section 20 of each portion 18 of the conductive film 12 located on the top and bottom faces of the insulative plate 10. If desired, an inward bent portion 24 may be formed on a free end of the beam section 22.

A solder ball (not shown) is then attached to the base section 20 of each conductive portion 18. Thereafter, the insulative plate 10 is cut to form individual socket connectors. The socket connector having contacts formed from the conductive portions 18 described above is a SMT/LGA type connector. The bottom face of the insulative plate 10 may be positioned on a circuit board with the base sections 20 of the conductive portions 18 being soldered to the circuit board by the solder balls. A CPU module may be positioned on the top face of the insulative plate 10 with conductors of the CPU module engage and resiliently deform the corresponding beam sections 22 of the conductive portions 18. In this respect, the beam sections 22 are spaced from the top face of the insulative plate 10 a predetermined distance for the resilient engagement with the conductors of the CPU module. The bent free ends 24 of the beam sections 22 facilitate electrical engagement with the conductors of the CPU module.

To ensure mechanical stability, the beam sections 22 are formed with a tapering configuration having a width reduced toward the free end.

The process described above provides a low profile socket connector having contacts shaped to provide the shortest path for electrical current between the CPU module and the circuit board thereby improving electrical properties thereof. Formation of the socket housing is simplified by using etching process to replace the conventional molding method whereby flaw rate is reduced and reliability is enhanced. Meanwhile, the pitch between contacts may be adjusted easily. It can be appreciated that a compressible layer may optionally be applied unto the top face of the insulative plate to supportably engage the deflected beam sections when those beam sections are deflected downwardly by the conductive pads of the CPU.

Although the present invention has been described with reference to the preferred embodiment, it is apparent to those skilled in the art that a variety of modifications and changes may be made without departing from the scope of the present invention which is intended to be defined by the appended claims. For example, the contacts may be modified to provide a LGA/LGA type socket connector.

What is claimed is:

1. A method for making a socket connector comprising the following steps:

(1) providing a thin laminate by attaching a conductive film to a bottom face of an insulative plate having a plurality of bores defined therein;

(2) removing first portions of the conductive film from the laminate with a second portion of the conductive film left in the laminate corresponding to each bore of the insulative plate, each second portion comprising a base section attached to the bottom face of the insulative plate adjacent the corresponding bore and a beam section extending from the base section over the corresponding bore; and (3) bending each beam section to have a remote end portion thereof extending through the corresponding bore and partially over the top face of the insulative plate to be substantially opposite to the base section, the remote end portion of the beam section being spaced from the top face of the insulative plate a predetermined distance.

2. The method as claimed in claim 1, wherein the laminate has an elongate structure, the insulative plate defining separate arrays of bores, the method further comprising a step of separating the laminate into individual socket connectors.

3. The method as claimed in claim 1 further comprising a step of electroplating the conductive film.

4. The method as claimed in claim 1 further comprising a step of inwardly bending a free end of each beam section of the second portion of the conductive film.

5. The method as claimed in claim 1, wherein the first portions of the conductive film are removed by photo etching.

6. The method as claimed in claim 1, wherein the first portions of the conductive film are removed by laser etching.

7. The method as claimed in claim 1 further comprising a step of attaching a solder ball to the base section of each second portion of the conductive film.

8. The method as claimed in claim 1, wherein the bores are formed by a photo etching technique.

9. The method as claimed in claim 1, wherein the bores are formed by a laser etching technique.

10. The method as claimed in claim 1, wherein the insulative plate is made of Kapton.

11. The method as claimed in claim 1, wherein the conductive film is made of BeCu.

12. The method as claimed in claim 1, wherein the beam sections are of a tapering configuration.

13. A method of making a socket, comprising the steps of:

providing an insulative plate defining opposite bottom and top surfaces thereon and therein a plurality of bores vertically extending therethrough in matrix arrangement;

laminating said insulative plate with a conductive film on the bottom surface thereof;

removing web type portions of the conductive film and leaving a plurality of contacts in matrix arrangement in respective alignment with the corresponding bores wherein each of said contacts defines a base section laminated on the bottom surface of the insulative plate, and a beam section extending from the base section toward and along said corresponding bore;

deflecting the beam of each of said contacts upwardly to project through the corresponding bore and further above the top surface with a predetermined distance.

14. The method as claimed in claim 13, wherein the beam section is reversely bent with regard to the base section to form a V-like configuration of the contact.

* * * * *